(12) United States Patent
Ahn

(10) Patent No.: US 9,584,110 B2
(45) Date of Patent: Feb. 28, 2017

(54) REFERENCE VOLTAGE GENERATOR HAVING NOISE CANCELLING FUNCTION AND CMOS IMAGE SENSOR USING THE SAME

(71) Applicant: SK hynix Inc., Gyeonggi-do (KR)

(72) Inventor: Peter Kyu Ahn, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/643,451

(22) Filed: Mar. 10, 2015

(65) Prior Publication Data

US 2016/0118978 A1    Apr. 28, 2016

(30) Foreign Application Priority Data

Oct. 24, 2014 (KR) ........................ 10-2014-0145185

(51) Int. Cl.
| | |
|---|---|
| *H04N 5/335* | (2011.01) |
| *H03K 17/16* | (2006.01) |
| *G05F 1/46* | (2006.01) |
| *H04N 5/374* | (2011.01) |
| *H04N 5/378* | (2011.01) |
| *H04N 5/357* | (2011.01) |

(52) U.S. Cl.
CPC .......... *H03K 17/165* (2013.01); *G05F 1/468* (2013.01); *H04N 5/357* (2013.01); *H04N 5/374* (2013.01); *H04N 5/378* (2013.01)

(58) Field of Classification Search
CPC ...... H03K 17/165; H04N 5/378; H04N 5/374; H04N 5/357
USPC ........................................................ 348/308
See application file for complete search history.

(56) References Cited

U.S. PATENT DOCUMENTS

| | | | |
|---|---|---|---|
| 2006/0055578 A1* | 3/2006 | Sushihara ........... | H03M 1/0604 341/155 |
| 2010/0238336 A1* | 9/2010 | Okamoto ............... | H04N 5/357 348/308 |

FOREIGN PATENT DOCUMENTS

KR    1020140083960    7/2014

* cited by examiner

*Primary Examiner* — Usman Khan
(74) *Attorney, Agent, or Firm* — IP & T Group LLP

(57) ABSTRACT

The reference voltage generator may include a reference current generation unit suitable for generating a reference current based on a first power supply voltage and a first ground voltage, a current amount adjustment unit suitable for adjusting a current amount of the reference current generated by the reference current generation unit based on a second power supply voltage and a second ground voltage, and a reference voltage generation unit suitable for generating a reference voltage corresponding to the reference current, of which the current amount is adjusted by the current amount adjustment unit, based on the first power supply voltage and the first ground voltage.

3 Claims, 2 Drawing Sheets

US 9,584,110 B2

REFERENCE VOLTAGE GENERATOR HAVING NOISE CANCELLING FUNCTION AND CMOS IMAGE SENSOR USING THE SAME

CROSS-REFERENCE TO RELATED APPLICATIONS

The present application claims priority of Korean Patent Application No. 10-2014-0145185, filed on Oct. 24, 2014, which is incorporated herein by reference in its entirety.

BACKGROUND

1. Field

Embodiments of the present invention relate to a complementary metal-oxide semiconductor (CMOS) image sensor (CIS) and, more particularly, to a reference voltage generator and a CIS using the same, which are capable of preventing pixel signals from being distorted due to power noise (for example, ground noise and supply noise) by cancelling or suppressing the power noise in the readout path of the CIS.

2. Description of the Related Art

In a typical column parallel structure, each comparator of a readout circuit operates in a differential mode, and thus, noise occurring due to a comparator supply voltage may be effectively cancelled in a common mode.

However, since power noise occurring in a pixel is applied to a readout circuit and included in a pixel signal, the power noise is not cancelled-out in the readout circuit and is outputted in the pixel data.

The power noise of the pixel may refer to supply noise or ground noise, or may be a combination of supply noise and ground noise through a specific circuit. More comprehensively, the power noise may be any type of power noise occurring in the pixels.

Since the power noise of the pixel is a major factor which generates horizontal noise in a CMOS image sensor (CIS), it is necessary to suppress or cancel the power noise of the pixel as much as possible.

In order to suppress or cancel the power noise of the pixel, a pixel signal and a reference signal (reference voltage) are to be transferred to a plus input terminal and a minus input terminal of a comparator, based on the same power supply.

A pixel supply voltage (VDDPX first power supply voltage) supplied to a pixel which outputs a pixel signal may be supplied to a reference voltage generator which generates a reference signal to transfer the pixel signal and the reference signal to two input terminals of the comparator based on the same power supply. At this time, the power may fluctuate due to a switching operation of a switching operation unit of the reference voltage generator, causing switching noise. The switching noise may be transferred to the readout circuit and be included in the reference signal without being filtered. Such noise increases horizontal noise in the CMOS image sensor.

SUMMARY

Various embodiments are directed to a reference voltage generator which uses a power supply designated for a reference signal in a switching operation-associated section, thereby preventing switching noise from being transferred to a readout circuit that is in the reference signal without being filtered.

Also, various embodiments are directed to a reference voltage generator capable of efficiently cancelling or suppressing power noise occurring due to the use of differential power supplies by using a diode-connected MOS and a current flowing therethrough.

Also, various embodiments are directed to a CMOS image sensor capable of efficiently cancelling or suppressing a power noise of a pixel signal by transferring the pixel signal and a reference signal to two input terminals of a comparator, based on the same power supply.

In an embodiment, a reference voltage generator may include a reference current generation unit suitable for generating a reference current based on a first power supply voltage and a first ground voltage, a current amount adjustment unit suitable for adjusting a current amount of the reference current generated by the reference current generation unit based on a second power supply voltage and a second ground voltage, and a reference voltage generation unit suitable for generating a reference voltage corresponding to the reference current, of which the current amount is adjusted by the current amount adjustment unit, based on the first power supply voltage and the first ground voltage.

The current amount adjustment unit supplied with the second power supply voltage and the second ground voltage may be linked to the reference current generation unit and the reference voltage generation unit supplied with the first power supply voltage and the first ground voltage by using a diode-connected metal-oxide semiconductor (MOS) and a current flowing therethrough.

In an embodiment, a complementary metal-oxide semiconductor (CMOS) image sensor includes a pixel suitable for outputting a pixel signal corresponding to incident light based on a first power supply voltage and a first ground voltage, a reference voltage generator suitable for generating a reference signal based on the first power supply voltage, the first ground voltage, a second power supply voltage and a second ground voltage, and a comparator suitable for comparing the pixel signal with the reference signal based on the first power supply voltage and the first ground voltage, wherein the reference voltage generator includes a first section associated with a switching operation and supplied with the second power supply voltage and the second ground voltage, and a second section associated with other operations than the switching operation and supplied with the first power supply voltage and the first ground voltage.

The reference voltage generator may comprise a reference current generation unit suitable for generating a reference current based on the first power supply voltage and the first ground voltage in the second section, a current amount adjustment unit suitable for adjusting a current amount of the reference current generated by the reference current generation unit based on the second power supply voltage and the second ground voltage in the first section, and a reference voltage generation unit suitable for generating the reference signal corresponding to the reference current, of which the current amount is adjusted by the current amount adjustment unit, based on the first power supply voltage and the first ground voltage in the second section.

The first section may be linked to the second section by using a diode-connected metal-oxide semiconductor (MOS) and a current flowing therethrough

DETAILED DESCRIPTION

Figure 1:
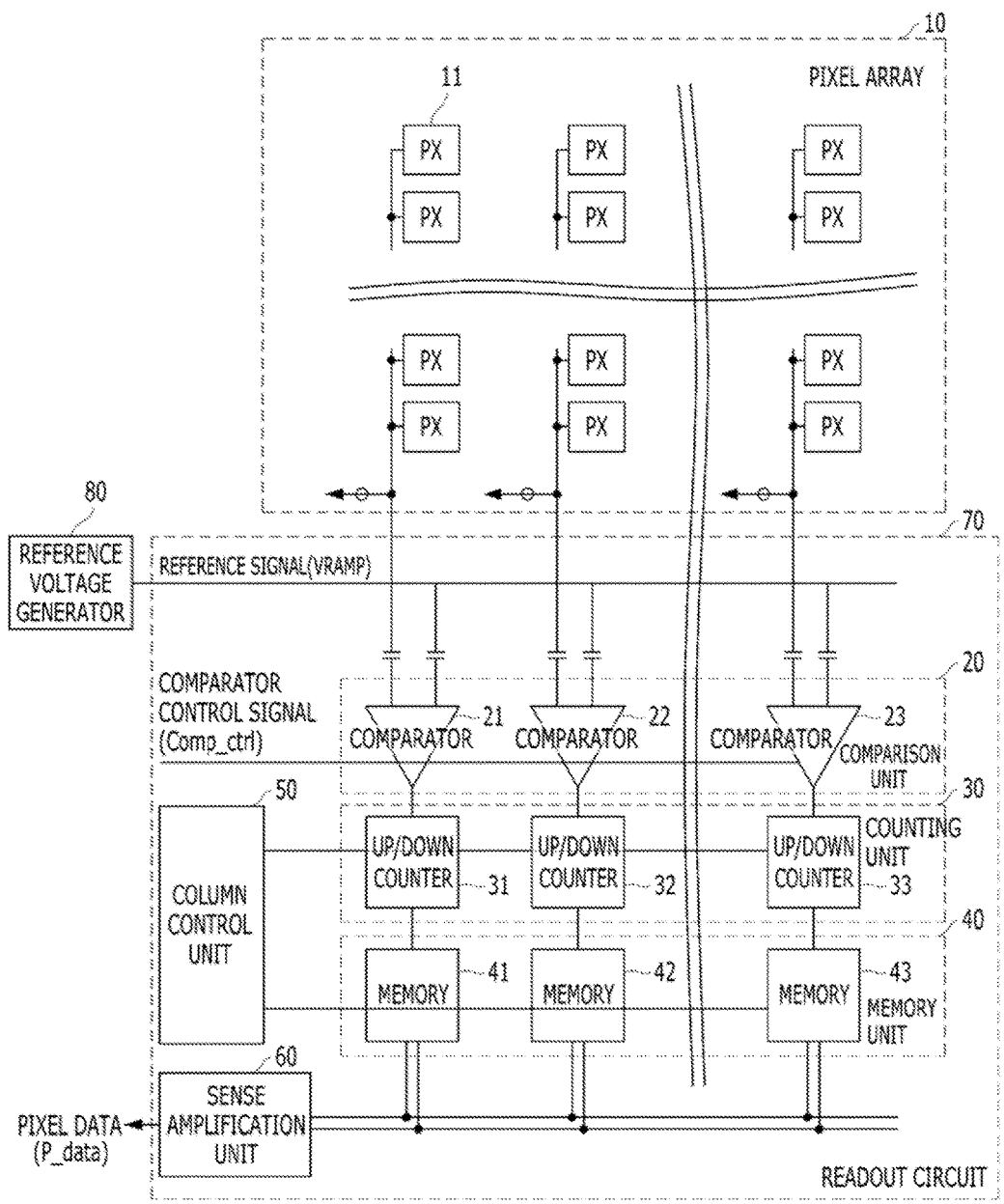
FIG. 1 is a configuration diagram of a pixel array, a readout circuit, and a reference voltage generator of a CMOS image sensor in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

When an element is referred to as being connected or coupled to another element, it should be understood that the former can be directly connected or coupled to the latter, or electrically connected or coupled to the latter via an intervening element therebetween. Furthermore, when it is described that one "comprises" (or "includes") or "has" some elements, it should be understood that it may comprise (or include) or have only those elements, or it may comprise (or include) or have other elements as well as those elements if there is no specific limitation. The terms of a singular form may include plural forms unless specifically stated otherwise.

FIG. 1 is a configuration diagram of a pixel array, a readout circuit, and a reference voltage generator of a CMOS image sensor in accordance with an embodiment of the present invention and it illustrates a general column parallel structure.

As illustrated in FIG, 1, a CMOS image sensor in accordance with an embodiment of the present invention includes a pixel array 10 suitable for outputting a pixel signal corresponding to incident light, a reference voltage generator 80 suitable for generating and outputting a reference signal (reference voltage), and a readout circuit 70. The readout circuit 70 includes a comparison unit 20 suitable for comparing a value of the pixel signal outputted from the pixel array 10 with a value of the reference signal (ramp signal) VRAMP applied from the reference voltage generator 80 in response to a comparator control signal Comp ctrl received from an external CIS controller (not illustrated in FIG. 1), a counting unit 30 suitable for counting an output signal of the comparison unit 20, a memory unit 40 suitable for storing counting information from the counting unit 30, a column control unit 50 suitable for controlling operations of the counting unit 30 and the memory unit 40, and a sense amplification unit 60 suitable for amplifying a signal corresponding to data stored in and outputted from the memory unit 40 and outputting pixel data P_data.

The comparison unit 20 includes a plurality of comparators 21 to 23, and the counting unit 30 includes a plurality of up/down counters 31 to 33, and the memory unit 40 includes a plurality of memories 41 to 43, In accordance with another embodiment, memories may be used instead of the up/down counters 31 to 33.

Next, the exemplary operation (analog-to-digital conversion operation) of the single comparator 21, the single up/down counter 31, and the single memory 41 will be described.

The first: comparator 21 has one terminal receiving a first pixel signal outputted from a first column pixel 11 of the pixel array 10 and the other terminal receiving a reference signal VRAMP applied from the reference voltage generator 80, and compares values of the two signal's in response to the comparator control signal Comp _ctrl received from the external CIS controller.

At this time, since a voltage level of the reference signal VRAMP decreases with time, the values (i.e., voltage levels) of the two signals inputted to the first comparator 21 are eventually matched with each other at a certain time point. The value outputted from the first comparator 21 is inverted after the certain time point.

The first up/down counter 31 counts the value outputted from the comparator 21 from a time point when the reference signal VRAMP starts to fall to a time point when the output of the first comparator 21 is inverted.

The first memory 41 stores and outputs the value (counting information) counted by the first up/down counter 31.

As such, the column parallel structure includes an analog-to-digital converter (ADC) in each column and is configured such that the value of the pixel signal outputted from each pixel 11 and the value of the reference signal VRAMP applied from the reference voltage generator 80 are compared in response to the comparator control signal Comp_ctrl received from the external CIS controller, and the value is counted until each comparator 21 completes its comparison and is then outputted.

At this time, each comparator 21 operates in a differential mode, and thus, a noise occurring due to a comparator supply voltage may be effectively cancelled in a common mode.

However, since the power noise occurring in the pixel 11 is applied to the readout circuit 70 with being included in the pixel signal, the power noise is not cancelled in the readout circuit 70 and is outputted with the pixel data P_data.

Since the power noise of the pixel 11 is one of the major factors which generate horizontal noise in CMOS image sensors, it is necessary to suppress or cancel as much power noise of the pixel 11 as possible.

In order to suppress or cancel the power noise of the pixel 11, the pixel signal and the reference signal (reference voltage) VRAMP are to be transferred to the two input terminals of the comparator 21, based on the same power supply.

In a case where a pixel supply voltage (VDDPX, first power supply voltage) supplied to the pixel 11 which outputs the pixel signal is supplied to the reference voltage generator 80 which generates the reference signal VRAMP, to transfer the pixel signal and the reference signal VRAMP to the two input terminals of the comparator 21 based on the same power supply, the power fluctuates due to a switching operation of a switching operation unit of the reference voltage generator 80, causing switching noise, The switching noise is transferred to the readout circuit 70 and included in the reference signal without being filtered. Such noise increases the horizontal noise in the CMOS image sensor.

Therefore, in accordance with embodiments of the present invention, a power supply designated for the reference signal VRAMP is used in a switching operation-associated section (for example, current amount adjustment unit) of the reference voltage generator 80, thereby preventing switching noise from being transferred to the readout circuit 70 and being included in the reference signal without being filtered. It is possible to efficiently cancel or suppress the power noise occurring due to the use of differential power supplies by using a diode-connected MOS and current flowing therethrough. It is possible to efficiently cancel or suppress the power noise of the pixel signal by transferring the pixel signal and the reference signal VRAMP to two input terminals of the comparator 21, based on the same power supply. Details will be described below with reference to FIGS. 2 and 3.

Figure 2:
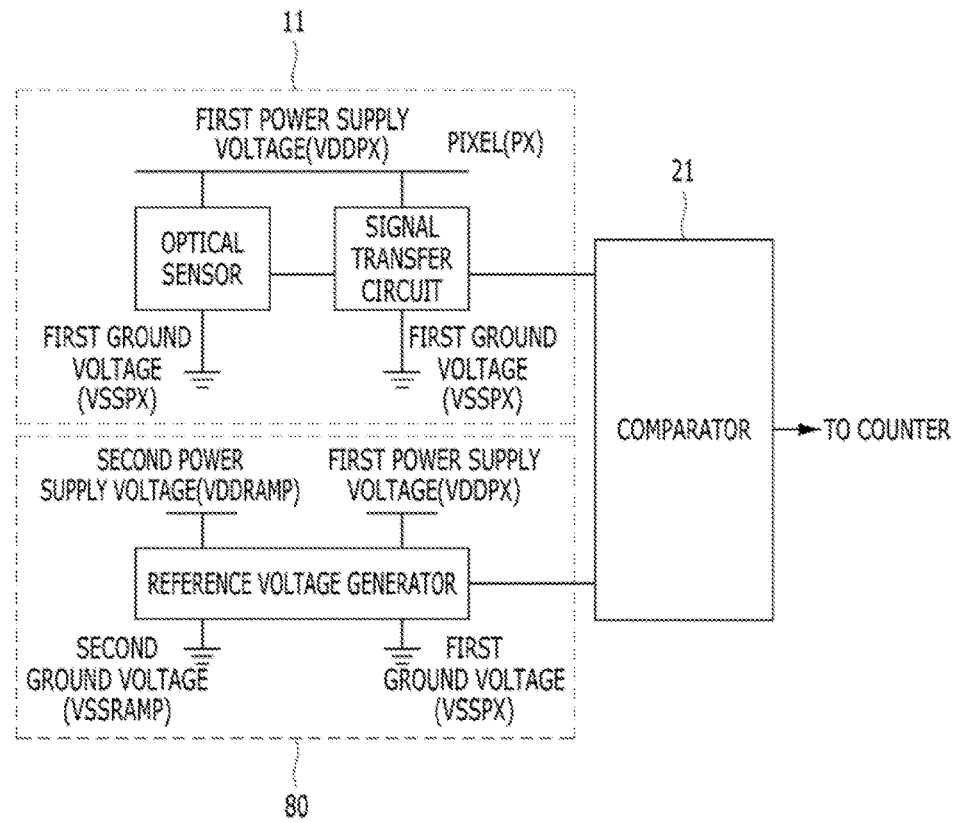
FIG. 2 is a configuration diagram of a CMOS image sensor in accordance with an embodiment of the present invention.

FIG. 2 is a configuration diagram of a CMOS image sensor in accordance with an embodiment of the present invention, which transfers a pixel signal and a reference signal to a plus input terminal and a minus input terminal of a comparator, respectively, based on the same power supply (first power supply voltage and first ground voltage).

As illustrated in FIG, 2, the CMOS image sensor in accordance with the embodiment of the present invention includes a pixel 11 suitable for outputting a pixel signal corresponding to incident light, based on the first power supply voltage VDDPX and the first ground voltage VSSPX, a reference voltage generator 80 suitable for generating a reference signal, based on the first power supply voltage VDDPX, the first ground voltage VSSPX, a second power supply voltage VDDRAMP and a second ground voltage VSSRAMP, and including a first section associated with a switching operation (switching operation-associated section) and a second section associated with other operations than the switching operation, and a comparator 21 suitable for comparing the pixel signal transferred from the pixel 11 with the reference signal transferred from the reference voltage generator 80, based on the first power supply voltage VDDPX and the first ground voltage VSSPX. The first section is supplied with the second power supply voltage VDDRAMP and the second ground voltage VSSRAMP to perform the switching operation, and the second section is supplied with the first power supply voltage VDDPX and the first ground voltage VSSPX to perform other operations than the switching operation.

In an embodiment of the present invention, the pixel signal and the reference signal are transferred to the plus input terminal and the minus input terminal of the comparator 21, based on the same power supply, thereby effectively cancelling and controlling the power noise of the pixel signal.

Next, the above elements will be described in more detail,

First, the pixel 11 includes an optical sensor and a signal transfer circuit, The optical sensor and the signal transfer circuit receive the first power supply voltage VDDPX as the supply voltage and are coupled to the terminal of the first ground voltage VSSPX. The optical sensor and the signal transfer circuit are operated to transfer the pixel signal corresponding to the incident light to the comparator 21.

In the reference voltage generator 80, the first section associated with the switching operation (for example, current amount adjustment unit) receives the second power supply voltage VDDRAMP as the supply voltage and is coupled to the terminal of the second ground voltage VSSRAMP. In the reference voltage generator 80, the section associated with the other operations than the switching operation (for example, reference current generation unit and reference voltage generation unit) receives the first power supply voltage VDDPX as the supply voltage and is coupled to the terminal of the first ground voltage VSSPX. As such, the reference voltage generator 80 is operated to generate the reference signal (reference voltage) and output the generated reference signal to the comparator 21.

The comparator 21 has one terminal receiving the pixel signal transferred from the pixel 11 based on the first power supply voltage VDDPX and the first ground voltage VSSPX and the other terminal receiving the reference signal VRAMP transferred from the reference voltage generator 80 based on the first power supply voltage VDDPX and the first ground voltage VSSPX. The comparator 21 compares the value of the pixel signal with the value of the reference signal VRAMP and outputs the comparison result to the counter.

Herein, the first power supply voltage VDDPX and the second power supply voltage VDDRAMP are different voltages. Although it is preferable that the first ground voltage VSSPX and the second ground voltage VSSRAMP are different voltages, the first ground voltage VSSPX and the second ground voltage VSSRAMP may be implemented using a single ground.

Figure 3:
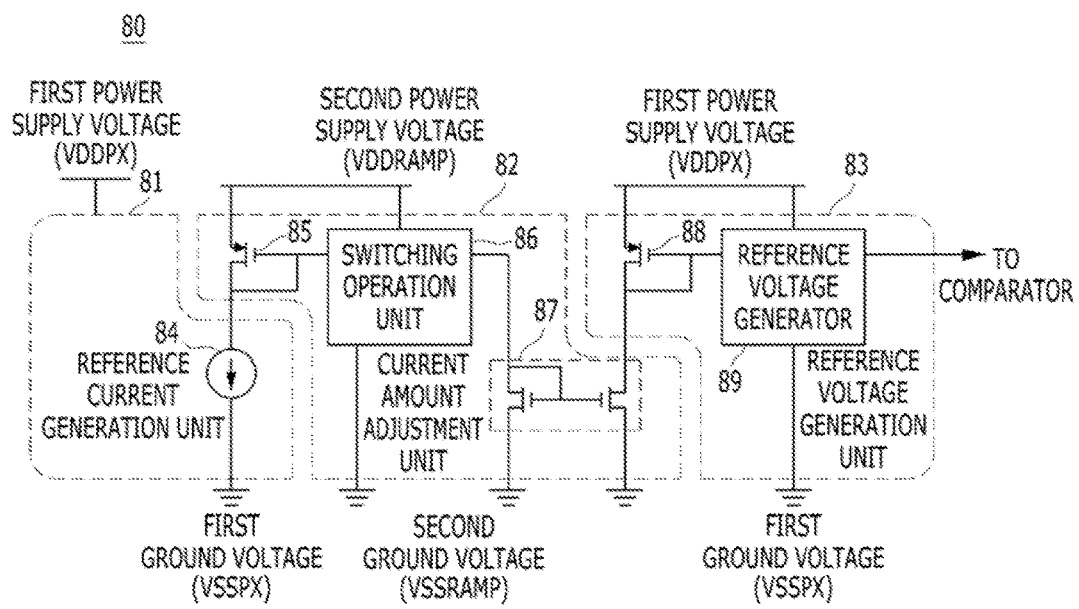
FIG. 3 is a configuration diagram of a reference voltage generator in accordance with an embodiment of the present invention.

FIG. 3 is a configuration diagram of a reference voltage generator in accordance with an embodiment of the present invention, which uses a power supply designated for the reference signal in the switching operation-associated section (current amount adjustment unit) and links power-separated sections using the diode-connected MOS and the current flowing therethrough, As illustrated in FIG. 3, the reference voltage generator 80 in accordance with the embodiment of the present invention includes a reference current generation unit 81 suitable for generating a reference current, based on the first power supply voltage VDDPX and the first ground voltage VSSPX, a current amount adjustment unit 82 suitable for adjusting a current amount of the reference current generated in the reference current generation unit 81, based on the second power supply voltage VDDRAMP and the second ground voltage VSSRAMP, and a reference voltage generation unit 83 suitable for generating the reference voltage (reference signal) corresponding to the reference current, of which the current amount is adjusted by the current amount adjustment unit 82, based on the first power supply voltage VDDPX and the first ground voltage VSSPX.

As such, in the embodiment of the present invention, by using the power supply designated for the reference signal (second power supply voltage and second ground voltage) in the current amount adjustment unit (switching operation-associated section) of the reference voltage generator, it is possible to prevent the switching noise from being transferred to the readout circuit and being included in the reference signal without being filtered.

In addition, the power-separated sections, e.g., the reference current generation unit 81 and the current amount adjustment unit, or the current amount adjustment unit 82 and the reference voltage generation unit 83, are linked by using the diode-connected MOS and the current flowing therethrough, thereby effectively cancelling or suppressing the power noise occurring due to the use of differential power supplies.

Next, the above elements will be described in more detail.

First, the reference current generation unit 81 receives the first power supply voltage VDDPX as the supply voltage and is coupled to the terminal of the first ground voltage VSSPX. The reference current generation unit 81 is operated to generate the reference current. The reference current generation unit 81 may be implemented with a current source 84. Since this is a well-known technology, a description thereof will be omitted.

The current amount adjustment unit 82 receives the second power supply voltage VDDRAMP as the supply voltage and is coupled to the terminal of the second ground voltage VSSRAMP. The current amount adjustment unit 82 is operated to adjust the current amount of the reference current generated by the reference generation unit 81. The current amount adjustment unit 82 includes a diode-connected MOS 85, a switching operation unit 38 with a switch circuit, and a plurality of MOSs 87. Since the technology for adjusting the current amount by using the switching operation unit 86 and the plurality of MOSs 87 is well known, a description thereof will be omitted.

In the embodiments of the present invention, the reference current generation unit 81 and the current amount adjustment unit 82 are linked by using the diode-connected MOS 85 and the current flowing therethrough.

The reference voltage generation unit 83 receives the first power supply voltage VDDPX as the supply voltage and is coupled to the terminal of the first ground voltage VSSPX. The reference voltage generation unit 83 is operated to generate the reference voltage corresponding to the reference current, of which the current amount is adjusted by the current amount adjustment unit 82, and outputs the generated reference voltage to the comparator 21. The reference voltage generation unit 83 includes a diode-connected MOS 88 and a reference voltage generator 89. The reference voltage generator 89 includes a current source and a resistor. Since the technology for generating the reference voltage by using the reference voltage generator 89 is well known, a description thereof will be omitted.

In the embodiments of the present invention, the current amount adjustment unit 82 and the reference voltage generation unit 83 are linked by using the diode-connected MOS 88 and the current flowing therethrough.

In accordance with the embodiment, the power supply designated for the reference signal is used in the switching operation-associated section of the reference voltage generator, thereby preventing the switching noise from being transferred to the readout circuit and being included in the reference signal without being filtered.

In addition, in accordance with the embodiment, it is possible to efficiently cancel or suppress power noise occurring due to the use of differential power supplies by using the diode-connected MOS and the current flowing therethrough.

Furthermore, it is possible to efficiently cancel or suppress the power noise of the pixel signal by transferring the pixel signal and the reference signal to two input terminals of the comparator based on the same power supply.

Although various embodiments have been described for illustrative purposes, it will be apparent to those skilled in the art that various changes and modifications may be made without departing from the spirit and scope of the invention as defined in the following claims.

What is claimed:

1. A complementary metal-oxide semiconductor (CMOS) image sensor comprising:
    a pixel outputting a pixel signal corresponding to incident light based on a first power supply voltage and a first ground voltage;
    a reference voltage generator generating a reference signal; and
    a comparator comparing the pixel signal with the reference signal based on the first power supply voltage and the first ground voltage,
    wherein the reference voltage generator includes:
    a reference current generator generating a reference current based on the first power supply voltage and the first ground voltage;
    a current amount adjuster adjusting the reference current generated by the reference generator based on a second power supply voltage and a second ground voltage; and
    a reference voltage generator generating the reference signal corresponding to the reference current, which is adjusted by the current adjuster, based on the first power supply voltage and the first ground voltage,
    wherein the second power supply voltage used for operating the current amount adjuster is a separate power supply voltage that is different from the first power supply voltage used for operating the pixel, the comparator, the reference current generator, and the reference voltage generator.

2. The CMOS image sensor of claim 1, wherein the current amount adjuster unit is linked to the reference current generator and the reference voltage generator by using a diode-connected metal-oxide semiconductor (MOS) and a current flowing therethrough.

3. The CMOS image sensor of claim 1, wherein the current amount adjuster is linked to the reference voltage generator by using a diode-connected metal-oxide semiconductor (MOS) and a current flowing therethrough.

\* \* \* \* \*